United States Patent [19]

Yamada et al.

[11] Patent Number: 5,477,807
[45] Date of Patent: Dec. 26, 1995

[54] PROCESS FOR PRODUCING SINGLE CRYSTAL OF POTASSIUM NIOBATE

[75] Inventors: Kazuhiro Yamada; Shuji Takemura; Hiroshi Mori, all of Sodegaura, Japan

[73] Assignee: Mitsui Petrochemical Industries, Ltd., Tokyo, Japan

[21] Appl. No.: 301,491

[22] Filed: Sep. 7, 1994

[30] Foreign Application Priority Data

Sep. 9, 1993 [JP] Japan ................................. 5-224251
Aug. 22, 1994 [JP] Japan ................................. 6-196976

[51] Int. Cl.$^6$ ................................................. C30B 30/02
[52] U.S. Cl. ........................................ 117/2; 117/948
[58] Field of Search ............................. 117/2, 948

[56] References Cited

U.S. PATENT DOCUMENTS

| | | |
|---|---|---|
| 3,565,577 | 2/1971 | Nassau et al. . |
| 4,867,516 | 9/1989 | Baken ................. 350/96.14 |
| 5,034,949 | 7/1991 | Gunter . |
| 5,043,622 | 8/1991 | Sagong et al. ............. 310/358 |
| 5,247,601 | 9/1993 | Myers et al. ............... 358/122 |

FOREIGN PATENT DOCUMENTS 0377402  7/1990  European Pat. Off. .

OTHER PUBLICATIONS

"Preparation of potassium niobate single crystal for optical applications", Chem Abst vol. 76, No. 16, 1972, pp. 523–524.

*Primary Examiner*—Robert Kunemund
*Attorney, Agent, or Firm*—Birch, Stewart, Kolasch & Birch

[57] ABSTRACT

There has been provided by the present invention a process for producing a single crystal of potassium niobate which comprises disposing a positive electrode directly or via a semi-insulating substance layer on one c-plane of a single crystal of potassium niobate and also a negative electrode via a semi-insulating substance layer on the other c-plane of the single crystal of potassium niobate, said positive and negative electrodes being disposed in mutually facing relationship, and applying voltage between the positive and negative electrodes so as to pole (convert to the single-domain state) the single crystal of potassium niobate, and which enables to pole the entire region of the single crystal of potassium niobate without quality deterioration.

12 Claims, 3 Drawing Sheets

PROCESS FOR PRODUCING SINGLE CRYSTAL OF POTASSIUM NIOBATE

FIELD OF THE INVENTION

The present invention relates to a process for producing a single crystal of potassium niobate employed as an optical element, such as a wavelength conversion element or a light modulation element.

BACKGROUND OF THE INVENTION

The single crystal of potassium niobate ($KNbO_3$) is now attracting attention as a nonlinear optical material or an electro-optical material. Especially, its capability of converting semiconductor laser beams, being monochromatic rays of about 860 or 980 nm, to ½ higher harmonics is so high that the utilization thereof as a nonlinear optical material is attracting intense attention.

The single crystal of potassium niobate may be obtained by heating a powdery mixture of potassium carbonate and niobium oxide ($Nb_2O_5$) at 1050° C. or higher to thereby melt the same, implanting seed crystals in the melt and gradually cooling the melt so as to attain crystal growth, as described in T. Fukuda and Y. Uematu, J.J.A.P. 11 (1972) 163. During the cooling of the formed single crystal of potassium niobate, a structural phase transition from the cubic system to the tetragonal system occurs at about 420° C., and another structural phase transition from the tetragonal system to the rhombic system occurs at about 210° C. At room temperature, the single crystal of potassium niobate being of the rhombic system and being in the poly-domain state, is obtained.

In the use of the single crystal of potassium niobate as an optical element, e.g., as a wavelength conversion element or a light modulation element, conventionally, the single crystal of potassium niobate is subjected to the treatment for conversion to the single-domain state, i.e., poling treatment. Referring to FIG. 5, this poling treatment comprises respectively forming a positive electrode 2 and a negative electrode 3 on the c-plane 5 and the c-plane 6 of the single crystal of potassium niobate 1 by coating with a conductive paste containing conductive powder, such as silver or carbon powder, or by vacuum evaporation of gold or the like and subsequently applying an electric field of at least 1 kV/cm between the positive and negative electrodes 2, 3 sandwiching the single crystal of potassium niobate 1 at about 200° C.

In this specification, the poly-domain state refers to a state in which a plurality of, or multiple adjacent domains having mutually different polarization directions are formed. The conversion of the poly-domain state to the single-domain state in which the polarization directions are uniformly arranged, is referred to as poling.

However, the above conventional poling treatment has a drawback in that it is difficult to pole the whole of the single crystal of potassium niobate, so that a poly-domain region remains, especially on the negative electrode side of the single crystal of potassium niobate.

Further, although the poly-domain region of the obtained single crystal of potassium niobate can slightly be decreased by increasing the electric field applied to the single crystal of potassium niobate or by extending the duration of the polling in the above conventional poling treatment, these unfavorably cause the single crystal of potassium niobate to suffer from quality deteriorations, such as coloring, resistivity decrease, and cracking.

Still further, in the above conventional poling treatment, application of a relatively high voltage while heating the single crystal causes the current to exhibit a gradual increase in spite of a constant voltage. Thus, there has been encountered the problem that the single crystal of potassium niobate is subjected to heat buildup, and to thereby suffers from cracking, or that a voltage drop is brought about with the result that no effective electric field can be applied to the single crystal of potassium niobate, e.g., practically only an electric field of about 1 kV/cm can be applied to the single crystal of potassium niobate when it is heated at 200° C.

With respect to the poling of ferroelectric crystals, pages 830 and 831 of Crystal Engineering Handbook published by Kyoritsu Shuppan Co., Ltd. (Sep. 25, 1985) disclose a technique of poling a single crystal of lithium niobate by sandwiching the same between lithium niobate ceramics, and page 831, left column, lines 7 to 10 describe that, although there is a disorder of domain structure at the surface contacting the ceramic at multiple minute parts, the complete single-domain state is obtained at least 0.5 mm inside the surface. As apparent from the description, the technique described in this publication cannot convert the whole of the single Crystal to the single-domain state.

Japanese Patent Laid-open Publication No. 1(1989)-172299 discloses a technique of poling in which the single crystal of lithium tantalate is sandwiched, with the use of powdery niobic acid or a sintered body thereof as a medium, between a pair of platinum electrodes and voltage is applied between the electrodes.

The above two publications describe the poling of the single crystals of lithium niobate and lithium tantalate, but therein there is no description relating to the polling of the single crystal of potassium niobate.

OBJECTS OF THE INVENTION

The object of the present invention is to resolve the above drawbacks of the prior art and to provide a process for producing a single crystal of potassium niobate of high quality which has been converted in its entirety to the single-domain state.

SUMMARY OF THE INVENTION

The process for producing a single crystal of potassium niobate according to the present invention comprises disposing a positive electrode on one c-plane (c-face) of a single crystal of potassium niobate and also a negative electrode via a semi-insulating substance layer on the other c-plane, opposite to the above c-plane, of the single crystal of potassium niobate, and applying voltage between the positive and negative electrodes so as to pole (convert to the single-domain state) the single crystal of potassium niobate.

In the process for producing a single crystal of potassium niobate according to the present invention, a semi-insulating substance layer may be disposed between the positive electrode and the c-plane of the single crystal of potassium niobate.

DETAILED DESCRIPTION OF THE INVENTION

The process for producing a single crystal of potassium niobate according to the present invention will be illustrated referring to the appended drawings.

Figure 1:
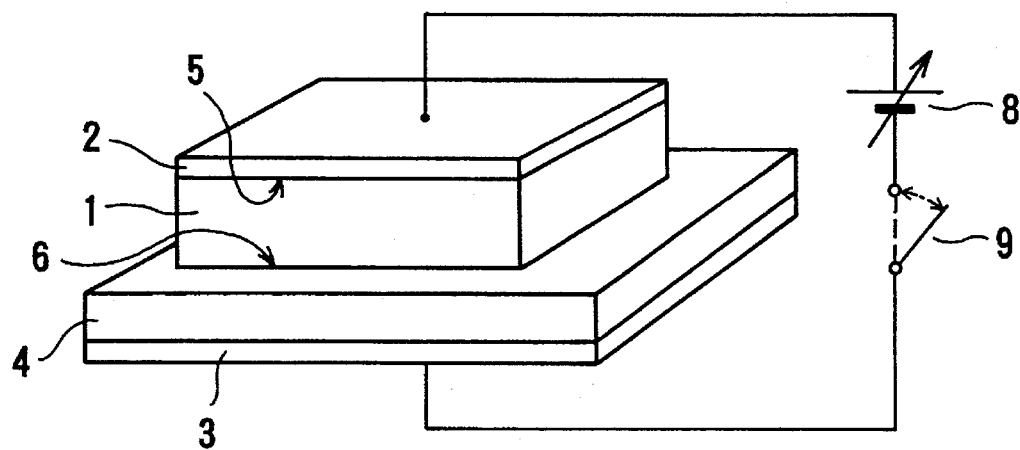
FIG. 1 is an explanatory view illustrating the process for producing a single crystal of potassium niobate according to the present invention.

In the process for producing a single crystal of potassium niobate according to the present invention, the conversion to the singles-domain state, i.e., the poling of the single crystal of potassium niobate 1 is effected by applying voltage between the positive electrode 2 disposed on the c-plane 5 of the single crystal of potassium niobate 1 and the negative electrode 3 disposed via the semi-insulating substance layer 4 on the c-plane 6 opposite to the c-plane 5, as exemplified in FIG. 1.

For example, the single crystal of potassium niobate prepared by effecting crystal growth in accordance with TSSG (Top Seeded Solution Growth) and cutting-out in a predetermined azimuth is used as the specimen for obtaining the single crystal of potassium niobate converted to the single-domain state by the poling treatment.

The positive electrode 2 disposed on the c-plane 5 of the single crystal of potassium niobate 1 for use as the specimen may be prepared by coating the c-plane 5 of the single crystal of potassium niobate 1 with a conductive paste containing conductive powder, such as silver powder or carbon powder, or by carrying out vacuum evaporation of conductive substance, such as gold or the like.

The negative electrode 3 is disposed via the semi-insulating substance layer 4 on the c-plane 6 opposite to the above c-plane 5.

When the resistivity of the semi-insulating substance layer 4 is too large, high voltage is required for maintaining the electric field applied to $KNbO_3$. On the other hand, when the resistivity of the semi-insulating substance layer 4 is too small, the semi-insulating substance layer 4 can no longer exhibit the desired effect. Therefore, the semi-insulating substance layer 4 for use in the present invention has a resistivity of generally from $10^5$ to $10^{11}$ Ω·cm, preferably from $10^6$ to $10^8$ Ω·cm at 170° to 220° C.

Examples of the semi-insulating substances used for forming the above semi-insulating substance layer 4 include glasses such as soda-lime, borosilicate and aluminoborosilicate glasses; ceramics such as alumina, cerium oxide, chromium oxide, hafnium oxide, magnesium oxide, silicon oxide, titanium oxide and zirconium oxide; and silicon doped with impurities to have its resistivity regulated.

The above semi-insulating substance may be amorphous or in the form of a single crystal or polycrystal. Further, it may be ferroelectric.

The thickness of this semi-insulating substance layer has a lower limit which is set by taking into account the thickness suitable for providing an electric field distribution effective for converting the single crystal of potassium niobate to the single-domain state and also the mechanical strength of the semi-insulating substance layer.

When the thickness of the semi-insulating substance layer is too large, most of the voltage applied by the power source acts on the semi-insulating substance layer, so that voltage required for conversion into the single-domain state can no longer be applied to the single crystal of potassium niobate. Therefore, the upper limit of the thickness of the semi-insulating substance layer is determined taking into account the electrode surface area and resistivity of the semi-insulating substance layer, the electrode surface area, thickness and resistivity of the single crystal of potassium niobate, the electric field required for poling the single crystal of potassium niobate and the magnitude of the voltage of available power source.

It is generally preferred from the above viewpoint that the thickness of the semi-insulating substance layer 4 be in the range of 0.1 to 10 mm, especially 1 to 5 mm. The semi-insulating substance layer is required to be in contact with the whole of the above c-plane of the single crystal of potassium niobate. The size of the plane of the semi-insulating substance layer brought into contact with the c-plane of the single crystal of potassium niobate may be greater than that of the above c-plane.

In the present invention, as described above, the polling of the single crystal of potassium niobate 1 is effected by applying a voltage by means of a power source 8 between the positive electrode 2 disposed on the c-plane 5 of the single crystal of potassium niobate 1 and the negative electrode 3 disposed via the semi-insulating substance layer 4 on the c-plane 6 opposite to the c-plane 5, with the use of a switch 9 connected therebetween.

In the poling treatment of the single crystal of potassium niobate 1, the electric field is applied while heating the single crystal of potassium niobate 1. When the heating temperature is too low or when the applied voltage is too low, the conversion to the single-domain state cannot be satisfactory. On the other hand, when the heating temperature is too high or when the applied voltage is too high, the single crystal of potassium niobate is likely to crack. It is generally preferred that voltage be applied between the positive and negative electrodes 2, 3 so as to apply an electric field of 2.0 to 5.0. kV/cm applied to the single crystal of potassium niobate 1 while heating the single crystal of potassium niobate 1 at 170° to 220° C.

Figure 2:
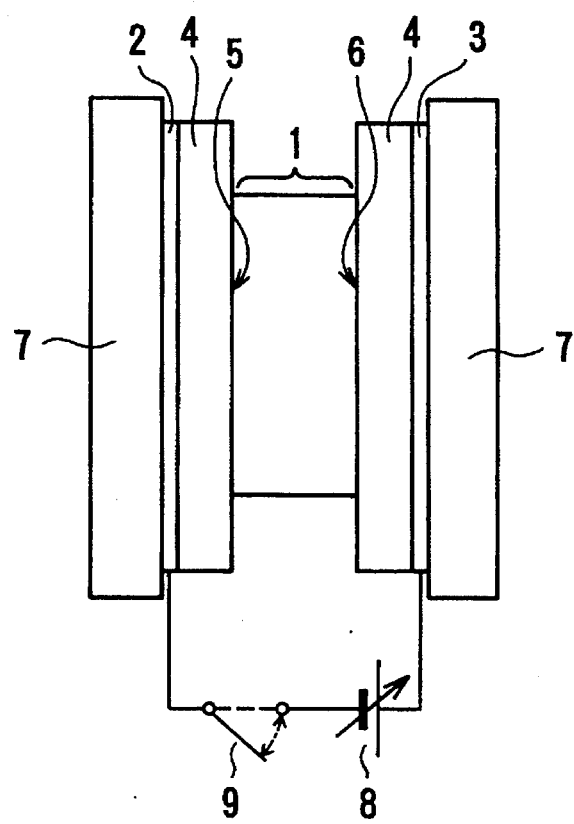
FIG. 2 is an explanatory sectional view illustrating the process for producing a single crystal of potassium niobate according to the present invention.

During the poling the single crystal of potassium niobate 1 may be arranged so that the c-axis thereof is either vertical as shown in FIG. 1, or horizontal as shown in FIG. 2. When the single crystal of potassium niobate 1 is arranged so that the c-axis thereof to be horizontal, the single crystal of potassium niobate 1, semi-insulating substance layer 4 and positive and negative electrodes 2, 3 may be sandwiched between buffers 7 while pressing the buffers 7 from not only the positive electrode 2 side but also from the negative electrode 3 side at strengths suitable for preventing the single crystal of potassium niobate 1 from sliding down.

The smaller the temperature difference between the opposite two c-faces of the single crystal of potassium niobate 1, the more preferred results would be obtained. During the voltage application, it is desired that the temperature difference be not greater than 0.5° C.

Figure 3:
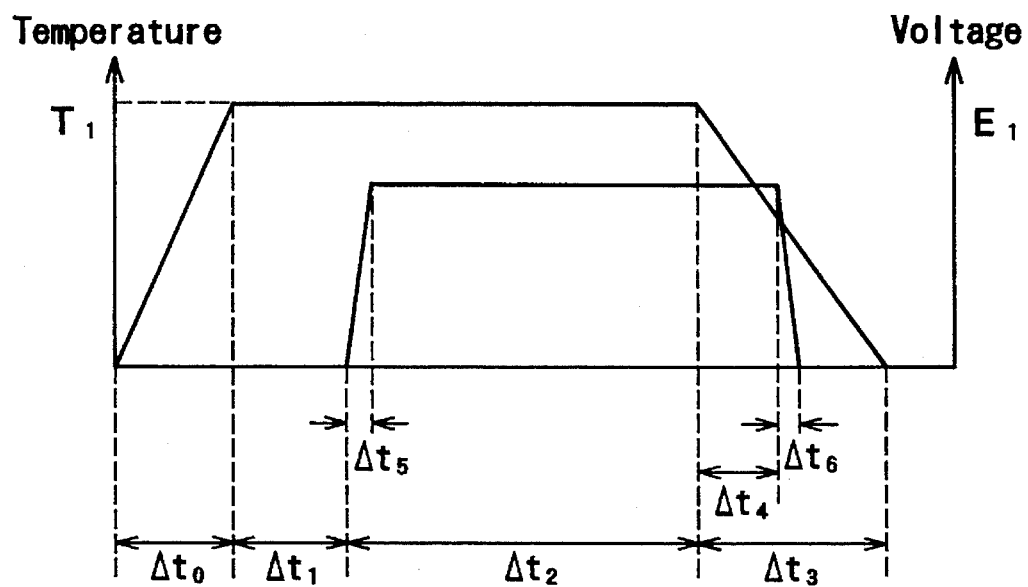
FIG. 3 is a diagram of an exemplary step to be taken in the process for producing a single crystal of potassium niobate according to the present invention.

The poling of the single crystal of potassium niobate 1 may be conducted, for example, according to the procedure as specified in FIG. 3.

That is, (1) the single crystal of potassium niobate 1 disposed between the positive and negative electrodes 2, 3 is heated at a temperature elevation rate of $T_1/\Delta t_0$ (for example, 200° C./hr) to temperature $T_1$ (for example, 200° C.), and (2) this temperature of the single crystal of potassium niobate 1 is maintained.

(3) A voltage is applied between the positive and negative electrodes 2, 3 after $\Delta t_1$ (for example, 30 min) from when the temperature of the single crystal of potassium niobate 1 has reached $T_1$ (for example, 200° C.). This voltage is gradually increased to $E_1$ over a period of time of $\Delta t_5$ (for example, 1 min).

(4) The single crystal of potassium niobate 1 is started to be cooled at a rate of $T_1/\Delta t_3$ (for example, 80° C./hr) after $\Delta t_2$ (for example, 30 min) from the start of the application of voltage between the positive and negative electrodes 2, 3.

(5) The application of voltage between the positive and negative electrodes 2, 3 is discontinued after $\Delta t_4$ (for example, 30 min) from the start of the cooling of the single crystal of potassium niobate 1. In discontinuing the voltage application, the application is gradually reduced to a voltage of 0 over a period of time of $\Delta t_6$ (for example, 1 min).

Figure 4:
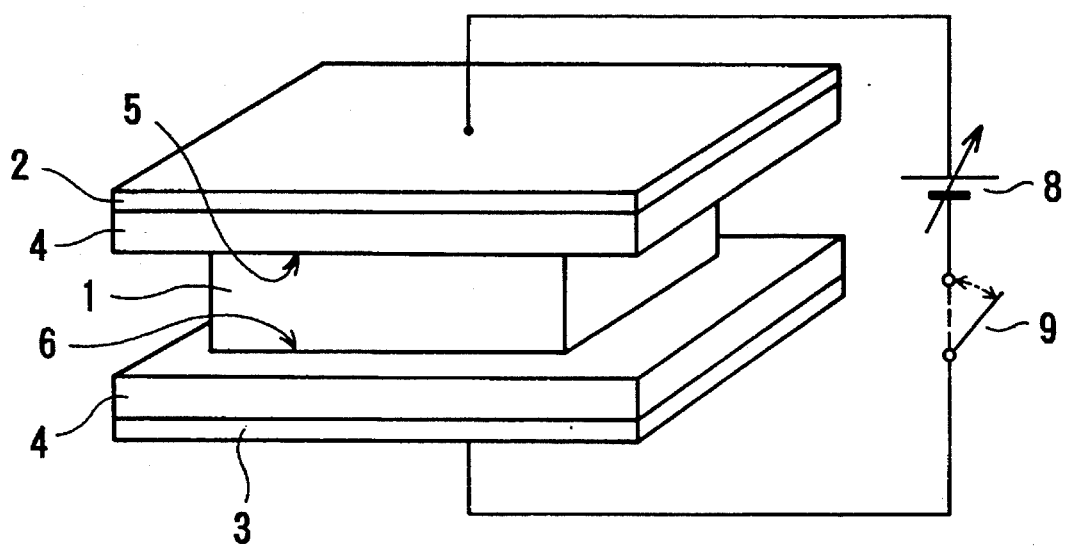
FIG. 4 is another explanatory view illustrating the process for producing a single crystal of potassium niobate according to the present invention.
Figure 5:
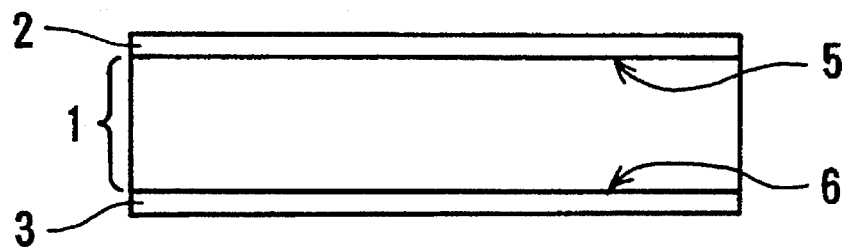
FIG. 5 is an explanatory view illustrating the conventional process for producing a single crystal of potassium niobate.

In the above process for producing the single crystal of potassium niobate, the positive electrode 2 is directly disposed on the c-plane 5 of the single crystal of potassium niobate 1 as shown in FIG. 1. However, the positive electrode 2 may be disposed via the semi-insulating substance layer 4 on the c-plane 5 of the single crystal of potassium niobate 1, as shown in FIG. 4.

EFFECT OF THE INVENTION

The process for producing the single crystal of potassium niobate according to the present invention is effective in converting the whole of the single crystal of potassium niobate to the single-domain state, without suffering from quality deteriorations, such as coloring and resistivity lowering, of the single crystal of potassium niobate, and without suffering from the remaining presence of a poly-domain in the vicinity of the negative electrode, which has especially been a problem in the conventional polling of the single crystal of potassium niobate, due to the satisfactory application of voltage along the c-axis of the single crystal of potassium niobate.

EXAMPLES

The effects of the present invention will now be described in greater detail with reference to the following Examples, which should not be construed as limiting the scope of the invention.

Example 1

A single crystal of potassium niobate (single crystal of $KNbO_3$) was grown in accordance with the TSSG method. Illustratively, potassium-enriched $KNbO_3$ powder was put in a platinum crucible having a diameter of 80 mm and a depth of 80 mm, and melted by resistance heating. Seeds were implanted in the surface of the resultant melt, and a single crystal of $KNbO_3$ was lifted at a revolving rate of 20 to 50 rpm. A single crystal with a size of 10×10×5 mm was cut out from the obtained single crystal of $KNbO_3$ with a size of 40×40×20 mm.

A c-plane (10 mm×5 mm) of the resultant single crystal of $KNbO_3$ was coated with a silver paste, thereby forming a positive electrode. A semi-insulating substance layer of soda-lime glass with a size of 20×10×3 mm, one side of which had been coated with a silver paste to thereby form a negative electrode, was brought into contact with the other c-plane of the single crystal of $KNbO_3$ opposite to the positive electrode so that the negative electrode is positioned outside. The resistivity of the soda-lime glass was $3 \times 10^7$ $\Omega \cdot cm$ at 200° C.

The resultant single crystal of $KNbO_3$ 1 having the positive electrode 2 disposed on the c-plane 5 and having the negative electrode 3 disposed via the semiinsulating substance layer 4 on the c-plane 6 opposite to the c-plane 5 as shown in FIG. 1, was horizontally placed in an electric furnace so that the c-axis was vertical. The positive and negative electrodes were connected via a switch 9 to a variable-voltage direct-current power source 8.

Subsequently, the single crystal of $KNbO_3$ was heated so that the temperature thereof rose to 200° C. in an hour, which temperature was maintained. After 30 minutes from the rise of the temperature of the single crystal of $KNbO_3$ to 200° C., a direct-current voltage was applied and gradually increased between the positive and negative electrodes so that an electric field of 4 kV/cm was applied to the single crystal of $KNbO_3$.

The single crystal of $KNbO_3$ was started to be cooled at a rate of 80° C./hr after 30 min from the start of the application of voltage to the positive and negative electrodes.

The application of voltage to the positive and negative electrodes was gradually reduced and stopped 30 min from the start of the cooling of the single crystal of $KNbO_3$.

After the decrease of the temperature of the thus polled single crystal of $KNbO_3$ to room temperature, the b- and c-planes of the single crystal of $KNbO_3$ were subjected to specular polishing, and an oblique ray observation of the c-plane and a polarizing-microscope observation of the polled single crystal of $KNbO_3$ in the vicinity of its c-plane on the negative electrode side through its b-plane perpendicular to the c-plane were conducted to judge whether or not the conversion of the single crystal of $KNbO_3$ to the single-domain state was effected by the polling treatment.

Thereafter, the single crystal of $KNbO_3$ was immersed in a liquid mixture of HF and $HNO_3$ at room temperature. Whether or not a poly-domain is remained in the poled single crystal of $KNbO_3$ was judged from the resultant etching pattern of the single crystal of $KNbO_3$.

As a result, the conversion of the single crystal of $KNbO_3$ by the poling to the single-domain state was confirmed. For example, by the polarizing-microscope observation of the poled single crystal in the vicinity of its c-plane on the negative electrode side through its b-plane (b-face) perpendicular to the c-plane, it was found that the above polled single crystal in the vicinity of the c-plane has solid color free of density nonuniformity. This indicated the :single-domain state in which the poled single crystal of $KNbO_3$ was uniformly polarized in the direction of the electric field applied during the poling.

Example 2

A poling test for the single crystal of $KNbO_3$ was conducted in the same manner as in Example 1, except that a semi-insulating substance layer 4 of soda-lime glass with a size of 20×10×3 mm, one side of which had been coated with a silver paste to thereby form a positive electrode, was bonded with the c-plane 5 of the single crystal of $KNbO_3$ 1 so as for the positive electrode to be positioned outside, as shown in FIG. 4. Thereafter, whether or not the conversion of the single crystal of $KNbO_3$ to the single-domain state was effected by the poling treatment, was judged.

As a result, the conversion of the single crystal of $KNbO_3$ by the poling to the single-domain state was confirmed.

Example 3

A poling test for the single crystal of $KNbO_3$ was conducted in the same manner as in Example 2, except that the heating of the single crystal of $KNbO_3$ was maintained at 220° C., and that the electric field applied to the single crystal of $KNbO_3$ was adjusted to 2 kV/cm. Thereafter, whether or not the conversion of the single crystal of $KNbO_3$ to the single-domain state was effected by the poling treatment, was judged.

As a result, the conversion of the single crystal of $KNbO_3$ by the poling to the single-domain state was confirmed.

Example 4

A poling test for the single crystal of $KNbO_3$ was conducted in the same manner as in Example 2, except that the heating of the single crystal of $KNbO_3$ was maintained at 220° C., and that the electric field applied to the single crystal of $KNbO_3$ was adjusted to 5 kV/cm. Thereafter, whether or not the conversion of the single crystal of $KNbO_3$ to the single-domain state was effected by the poling treatment, was judged.

As a result, the conversion of the single crystal of $KNbO_3$ by the poling to the single-domain state was confirmed.

Example 5

A poling test for the single crystal of $KNbO_3$ was conducted in the same manner as in Example 2, except that the heating of the single crystal of $KNbO_3$ was maintained at 170° C. and that the electric field applied to the single crystal of $KNbO_3$ was adjusted to 5 kV/cm. Thereafter, whether or not the conversion of the single crystal of $KNbO_3$ to the single-domain state was effected by the poling treatment, was judged.

As a result, the conversion of the single crystal of $KNbO_3$ by the poling to the single-domain state was confirmed.

Example 6

A single crystal with a size of 30×6×6 mm was cut out from the single crystal of $KNbO_3$ with a size of 40×40×20 mm as obtained in Example 1.

A c-plane (30 mm×6 mm) of the resultant single crystal of $KNbO_3$ was coated with a silver paste, thereby forming a positive electrode. A semi-insulating substance layer of soda-lime glass with a size of 40×20×3 mm (3 mm: thickness), one side of which had been coated with a silver paste to thereby form a negative electrode, was bonded with the other c-plane of the single crystal of $KNbO_3$ opposite to the positive electrode so that the negative electrode was positioned outside. The volume resistivity of the soda-time glass was $3\times10^7$ Ω·cm at 200° C.

A poling test for the single crystal of $KNbO_3$ was conducted in the same manner as in Example 1, except that the resultant single crystal of $KNbO_3$ having a positive electrode disposed on a c-plane and having a negative electrode disposed via a semi-insulating substance layer on the c-plane opposite to the above c-plane was placed in an electric furnace so that the c-axis thereof was horizontal, as shown in FIG. 2. Then, whether or not the conversion of the single crystal of $KNbO_3$ to the single-domain state was effected by the poling treatment, was judged. At the time of the poling of the single crystal of $KNbO_3$, the single crystal of potassium niobate ($KNbO_3$) 1, semi-insulating substance layer 4 and positive and negative electrodes were sandwiched between silicone rubber parts (buffers 7) while pressing these on both the right and left exposed sides thereof at appropriate strengths with the use of a press tool (not shown).

As a result, the conversion of the single crystal of $KNbO_3$ by the poling to the single-domain state was confirmed.

Comparative Example 1

The two opposite c-faces of a single crystal of potassium niobate were coated with a silver paste to form electrodes, which were connected to a direct current power source.

An attempt to pole the single crystal of potassium niobate in the same manner as in Example 1 showed that an increase in the voltage of the power source caused the current flow to nonlinearly increase, thereby bringing about a fall of an effective resistance value. Thus, in the above process, the electric field applied to the single crystal of potassium niobate could not be increased to a level proportional to an increment of the voltage of the power source.

Actually, the above poling of the single crystal of potassium niobate while heating could produce only an electric field of about 1 kV/cm on the single crystal of potassium niobate when the single crystal of potassium niobate was heated at 200° C. Therefore, the poling was performed at 200° C. in an electric field of 1 kV/cm.

As a result, a polarizing-microscope observation showed the presence of the poly-domain state up to about 5 mm on the b-plane perpendicular to the c-plane and in the vicinity of from the c-plane on the negative electrode side in the polled single crystal of potassium niobate. The observation result is diagrammatically illustrated in FIG. 6.

Figure 6:
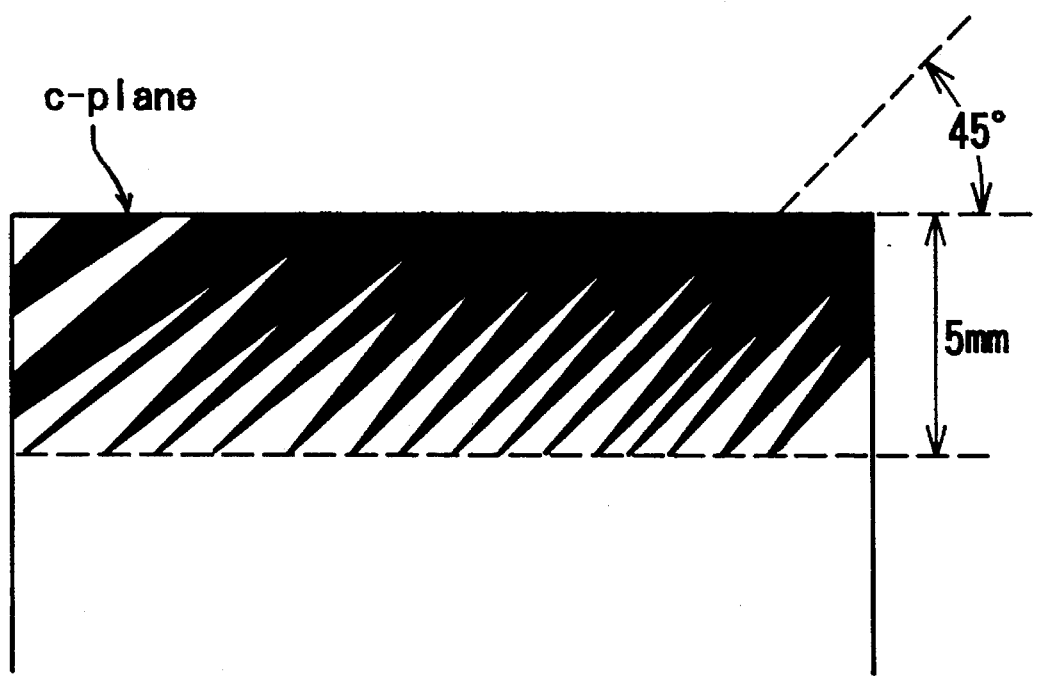
FIG. 6 is a diagrammatic illustration of a polarization micrograph of the single crystal of potassium niobate produced by the conventional process.

FIG. 6 shows a diagrammatic illustration of a polarization micrograph of the poled single crystal of potassium niobate in the vicinity of its c-plane on the negative electrode side through its b-plane perpendicular to the c-plane. As shown in FIG. 6, there are lights and shades divided by spheroidal outlines in the vicinity of the c-plane on the negative electrode side. Black parts (shades) of FIG. 6 indicate the polarization different from the direction of the electric field during the poling, in contrast with the white parts (lights) of FIG. 6. In this Comparative Example, the protrudent edges of the spheroidal shades (lying nearly along a broken line in FIG. 6) lie about 5 mm inside the above c-plane, and the outlines dividing the lights and shades each tilt at an angle of about 45° with the c-plane.

What is claimed is:

1. A process for poling a single crystal of potassium niobate, comprising:
   (A) disposing a positive electrode on a first c-plane side of a single crystal of potassium niobate;
   (B) disposing a layer of a semi-insulating substance on a second c-plane of said single crystal of potassium niobate opposite to said first c-plane;
   (C) disposing a negative electrode on a surface of said layer of semi-insulating substance; and
   (D) applying a voltage between said positive and negative electrode sufficient to pole said single crystal of potassium niobate.

2. The process as claimed in claim 1, wherein said disposing step (A) comprises disposing said positive electrode directly on a surface of said first c-plane of said single potassium niobate crystal.

3. The process as claimed in claim 1, wherein said disposing step (A) comprises disposing a layer of a semi-insulating substance on a surface of said first c-plane, and disposing said positive electrode on a surface of said layer of semi-insulating substance.

4. The process according to claim 1 or 2, wherein said applying of said voltage further comprises heating said single crystal of potassium niobate to a temperature of 170° to 220° C.

5. The process according to claim 1, wherein said applying of said voltage comprises applying a voltage sufficient to create an electric field of 2.0 to 5.0 kV/cm.

6. The process according to claim 1 or 2, wherein said semi-insulating substance has a resistivity of $10^6$ to $10^8$ $\Omega$-cm at a temperature of 170° to 220° C.

7. The process according to claim 1, wherein said semi-insulating substance is selected from the group consisting of glasses, ceramics and doped silicons.

8. The process according to claim 1, wherein said layer of semi-insulating substance has a thickness of from 0.1 to 10 mm.

9. The process according to claim 1, wherein said semi-insulating substance is disposed over the entire surface of said c-plane of said single potassium niobate crystal.

10. The process according to claim 1 or 2, wherein said single crystal of potassium niobate is arranged to have a vertical c-axis.

11. The process according to claim 1 or 2, wherein said single crystal of potassium niobate is arranged to have a horizontal c-axis, and further comprising disposing buffers on outer surfaces of said positive and negative electrodes.

12. The process according to claim 1, wherein said first c-plane and said second c-plane have a temperature difference of 0.5° C.

\* \* \* \* \*